United States Patent
Matsumura et al.

(10) Patent No.: US 9,117,979 B2
(45) Date of Patent: Aug. 25, 2015

(54) PHOSPHOR SHEET, LED AND LIGHT EMITTING DEVICE USING THE SAME AND METHOD FOR MANUFACTURING LED

(75) Inventors: Nobuo Matsumura, Otsu (JP); Yutaka Ishida, Otsu (JP); Kazunari Kawamoto, Otsu (JP); Kazuki Goto, Chuo-ku (JP); Takao Kitagawa, Otsu (JP); Takejiro Inoue, Otsu (JP); Hironobu Sadakuni, Otsu (JP); Hiroki Sekiguchi, Otsu (JP); Masahiro Yoshioka, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 13/993,530

(22) PCT Filed: Dec. 1, 2011

(86) PCT No.: PCT/JP2011/077802
§ 371 (c)(1),
(2), (4) Date: Jun. 12, 2013

(87) PCT Pub. No.: WO2012/081411
PCT Pub. Date: Jun. 21, 2012

(65) Prior Publication Data
US 2013/0264601 A1   Oct. 10, 2013

(30) Foreign Application Priority Data

Dec. 13, 2010  (JP) .................................. 2010-276745
Aug. 11, 2011  (JP) .................................. 2011-175666

(51) Int. Cl.
*H01L 33/50*   (2010.01)
*H01L 33/52*   (2010.01)
(Continued)

(52) U.S. Cl.
CPC ............... *H01L 33/502* (2013.01); *C08L 83/04* (2013.01); *H01L 33/005* (2013.01); *H05B 33/14* (2013.01); *H01L 33/501* (2013.01); *H01L 33/505* (2013.01); *H01L 2224/48091* (2013.01); *H01L 2224/49107* (2013.01); *H01L 2224/73265* (2013.01); *Y10T 156/10* (2015.01)

(58) Field of Classification Search
None
See application file for complete search history.

(56) References Cited

U.S. PATENT DOCUMENTS 6,066,861 A * 5/2000 Hohn et al. ..................... 257/99
6,495,649 B2 * 12/2002 Harada et al. ................. 528/39

(Continued)

FOREIGN PATENT DOCUMENTS

| EP | 1 424 363 A1 | 6/2004 |
| EP | 1 980 591 | 10/2008 |

(Continued)

OTHER PUBLICATIONS

Machine Translation of JP 2006-321832.*

(Continued)

*Primary Examiner* — Joseph Schoenholtz
(74) *Attorney, Agent, or Firm* — RatnerPrestia

(57) ABSTRACT

The present invention provides a phosphor sheet in which the optical properties thereof are not impaired and which exhibits excellent film thickness uniformity even when comprising large-sized phosphor particles in high concentration. In one embodiment, the invention provides a phosphor sheet in which the content of phosphor is 53 weight % or more of the total sheet, and in another embodiment, a phosphor sheet includes at least a silicone resin, a phosphor and silicone fine particles.

16 Claims, 1 Drawing Sheet

(51) Int. Cl.
- *H01L 33/56* (2010.01)
- *H01L 33/54* (2010.01)
- *H01L 33/00* (2010.01)
- *H05B 33/14* (2006.01)
- *C08L 83/04* (2006.01)

(56) References Cited

U.S. PATENT DOCUMENTS

| | | | |
|---|---|---|---|
| 6,504,301 B1 * | 1/2003 | Lowery | 313/512 |
| 6,806,161 B2 * | 10/2004 | Ko et al. | 438/409 |
| 7,045,956 B2 | 5/2006 | Braune | |
| 7,049,159 B2 * | 5/2006 | Lowery | 438/22 |
| 7,910,940 B2 | 3/2011 | Koike | |
| 8,541,103 B2 * | 9/2013 | Fukui et al. | 428/402.24 |
| 2005/0253130 A1 | 11/2005 | Tsutsumi | |
| 2007/0041191 A1 | 2/2007 | Okada | |
| 2007/0096131 A1 * | 5/2007 | Chandra | 257/99 |
| 2007/0126020 A1 | 6/2007 | Lin | |
| 2007/0176196 A1 | 8/2007 | Kim | |
| 2007/0298256 A1 * | 12/2007 | Fukui et al. | 428/402.24 |
| 2008/0231170 A1 | 9/2008 | Masato | |
| 2008/0308828 A1 | 12/2008 | Kashiwagi et al. | |
| 2009/0143505 A1 * | 6/2009 | Samukawa et al. | 524/89 |
| 2009/0212257 A1 * | 8/2009 | Sohn et al. | 252/301.36 |
| 2010/0295079 A1 * | 11/2010 | Melman | 257/98 |
| 2011/0045619 A1 * | 2/2011 | Ling | 438/29 |
| 2011/0063872 A1 * | 3/2011 | Irie | 362/565 |
| 2011/0186340 A1 | 8/2011 | Kuramoto | |
| 2013/0011617 A1 | 1/2013 | Tasaki | |
| 2013/0125365 A1 * | 5/2013 | Goto et al. | 29/428 |

FOREIGN PATENT DOCUMENTS

| | | |
|---|---|---|
| EP | 2060537 | 5/2009 |
| EP | 2 189 509 | 5/2010 |
| EP | 2 189 509 A1 | 5/2010 |
| EP | 2 537 899 | 12/2012 |
| JP | 05-152609 | 6/1993 |
| JP | 07-099345 | 4/1995 |
| JP | 2000-156528 A | 6/2000 |
| JP | 2004-343149 A | 12/2004 |
| JP | 200542099 | 2/2005 |
| JP | 200564233 | 3/2005 |
| JP | 2006321832 | 11/2006 |
| JP | 2006321832 A * | 11/2006 |
| JP | 2006339581 | 12/2006 |
| JP | 200819424 | 1/2008 |
| JP | 2008159713 | 7/2008 |
| JP | 2009173694 | 8/2008 |
| JP | 2009120437 | 6/2009 |
| JP | 2009-530437 A | 8/2009 |
| JP | 2009-235368 A | 10/2009 |
| JP | 2010044874 | 2/2010 |
| JP | 2010-100743 A | 5/2010 |
| JP | 2010-123802 A | 6/2010 |
| JP | 2010-159411 A | 7/2010 |
| JP | 2010-285593 A | 12/2010 |
| JP | 2011-102004 A | 5/2011 |
| JP | 2011-184625 A | 9/2011 |
| WO | WO 2010/132160 A1 | 11/2010 |

OTHER PUBLICATIONS

Definition of contain downloaded from URL <http://www.merriam-webster.com/dictionary/contain> downloaded on Dec. 1, 2014.*
International Search Report dated Mar. 6, 2012, application No. PCT/JP2011/077802.
European Search Report corresponding to application No. EP 11 84 9012, dated Mar. 28, 2014.
European Search Report dated Oct. 1, 2013, application No. 11 744 559.3.
International Search Report dated May 24, 2011, application No. PCT/JP2011/052718.
Entire patent prosecution history of U.S. Appl. No. 13/578,388, filed Jan. 29, 2013, entitled, Phosphor-Containing Cured Silicone, Process for Production of Same, Phosphor-Containing Silicone Composition, Precursor of the Composition, Sheet-Shaped Moldings, LED Package, Light-Emitting Device, and Process for Production of LED-Mounted.
Singapore Search Report and Written Opinion dated Sep. 8, 2014, application No. 2013038070.
Office Action dated Dec. 5, 2014 for U.S. Appl. No. 13/578,388.
Final Office Action mailed Mar. 17, 2015 for U.S. Appl. No. 13/578,388.

* cited by examiner

PHOSPHOR SHEET, LED AND LIGHT EMITTING DEVICE USING THE SAME AND METHOD FOR MANUFACTURING LED

CROSS REFERENCE TO RELATED APPLICATIONS

This application is the U.S. National Phase application of PCT International Application No. PCT/JP2011/077802, filed Dec. 1, 2011, and claims priority to Japanese Patent Application No. 2010-276745, filed Dec. 13, 2010, and Japanese Patent Application No. 2011-175666, filed Aug. 11, 2011, the disclosures of each of these applications being incorporated herein by reference in their entireties for all purposes.

FIELD OF THE INVENTION

The present invention relates to a phosphor sheet for converting an emission wavelength of an LED chip.

BACKGROUND OF THE INVENTION

A light emitting diode (LED) is rapidly expanding its market for a backlight of a liquid crystal display (LCD) and for lighting in automotive applications such as headlight because of a low power consumption, a long life time and design against the background of significant improvement in luminous efficacy. In the future, the LED is expected to form an enormous market also in the general lighting field because of a low environmental burden.

An emission color of an LED is limited since an emission spectrum of the LED depends on a semiconductor material for forming the LED chip. Therefore, in order to obtain LCD backlight or white light for general lighting by using an LED, it is necessary that a phosphor suitable for an LED chip is arranged on the LED chip to convert an emission wavelength. Specifically, a method of disposing a yellow phosphor on an LED chip to emit blue light, a method of disposing a red phosphor and a green phosphor on an LED chip to emit blue light, and a method of disposing a red, a green and a blue phosphors on an LED chip to emit ultraviolet light are proposed. Among these methods, the method of disposing a yellow phosphor on an LED chip to emit blue light, and the method of disposing a red phosphor and a green phosphor on a blue phosphor are currently most widely employed from the viewpoints of luminous efficacy and cost standpoints of the LED chip.

For example, Patent Literatures 1 to 2 propose a method of dispersing a phosphor in a liquid resin for encapsulating an LED chip as a specific method of disposing a phosphor on an LED chip. However, when the dispersion of the phosphor in the liquid resin is nonuniform, color deviation is produced with respect to each chip.

Then, a method of using a sheet-like resin layer (phosphor sheet) in which a fluorescent material is previously dispersed uniformly is proposed (for example, Patent Literatures 3 to 8). This method is superior in that a constant amount of a phosphor can be more easily arranged on an LED chip than a method of dispensing a liquid resin, in which a phosphor heretofore put to practical use is dispersed, on an LED chip and curing the resin, and color and brightness of the resulting white LED can be uniform.

PATENT LITERATURES

[PTL 1] Japanese Patent Laid-open Publication No. 5-152609
[PTL 2] Japanese Patent Laid-open Publication No. 7-99345
[PTL 3] Japanese Patent Publication No. 4146406
[PTL 4] Japanese Patent Laid-open Publication No. 2010-156528
[PTL 5] Japanese Patent Laid-open Publication No. 2009-235368
[PTL 6] Japanese Patent Laid-open Publication No. 2010-123802
[PTL 7] Japanese Patent Publication No. 2011-102004
[PTL 8] Japanese Patent Laid-open Publication No. 2010-159411

SUMMARY OF THE INVENTION

In order to apply the LED to general lighting uses, it is required to sustain light emitting of high brightness for a long time. Therefore, light resistance of withstanding long periods of light emitting is required of an LED encapsulation material. However, when a conventional phosphor sheet is used as an LED encapsulation material, its light resistance is not sufficient.

The reason for this is probably as follows. In the case of a high-power LED which is preferably served for general lighting uses, since a rated electric power which is as large as 1 W or more can be input, luminous flux (a physical amount representing brightness of all light emitted from a light source to a certain direction) is very high. Therefore, light quantity (brightness) emitted from a unit area increases. When a phosphor-containing encapsulation material receives such light, the phosphor is optically-degraded since crystal defects are formed within the phosphor or on the surface of the phosphor. This causes brightness of an LED to be lowered.

The present inventors have made earnest investigations concerning light resistance of the phosphor sheet, and consequently have found that it is important to raise a concentration of phosphor in the phosphor sheet for preventing degradation of the phosphor sheet due to light generated from an LED chip in order to improve light resistance of the phosphor sheet.

On the other hand, technology concerned with the phosphor sheet has the following problem. The method of bonding the phosphor sheet to the LED chip is more excellent than the method of using a liquid phosphor resin in that color and brightness are stabilized, as described above, but it is very difficult to form a resin having phosphor particles dispersed therein uniformly into a sheet. In order to improve the flowability of the phosphor particles in the resin liquid in a process of forming the resin into a sheet, thereby improving the thickness uniformity of a sheet to be prepared, it is preferred to reduce the particle size of the phosphor particles about below 1 μm. However, a percentage of the surface defect increases and luminous efficacy is deteriorated as the particle size of the phosphor particles is reduced. Further, since all of inorganic phosphors currently used in LED uses have very high hardness, it is difficult to produce particles having adequately small particle size by pulverizing. Accordingly, in the phosphor used in white LED uses, phosphor particles having a particle size of several μm to about 10 μm are employed.

Therefore, it is required, of the phosphor sheet to be bonded to the LED chip, to manufacture a sheet which has such large-sized phosphor particles uniformly dispersed therein and whose thickness is uniform while containing such phosphor particles in a high concentration.

However, conventional phosphor sheets for an LED are not adequately considered concerning such problems, and a sheet having such a uniform thickness is not realized. In order to improve the flowability of a coating solution including dispersed particles, in general, it may be effective to add a small amount of particles each having a different particle size. For example, Patent Literature 8 discloses that silica fine particles are added to the phosphor sheet for the purpose of improving the strength of a sheet. When such fine particles are added, there is a possibility that the flowability of the coating solution for preparing a phosphor sheet is improved and the thickness uniformity of the phosphor sheet is improved, but on the other hand, the addition impairs the transparency of the silicone resin. When silica or alumina differing in composition from the silicone resin is added to the silicone resin, scattering of light ray occurs to decrease a transmittance of light, and as a result, when the phosphor sheet is used as a wavelength conversion sheet of an LED element, there are problems that brightness is deteriorated or uneven brightness is generated.

In view of the above-mentioned problems, one aspect of the present invention provides a sheet to be used for an LED encapsulation material and the like, which is excellent in light resistance. Further, another aspect of the present invention provides a phosphor sheet which has optical properties not impaired and which exhibits excellent thickness uniformity even when containing large-sized phosphor particles in a high concentration.

An embodiment of the present invention is aimed at preventing the degradation of the phosphor sheet due to light generated from an LED chip by increasing the content of the phosphor in the phosphor sheet to a certain level or more. That is, one embodiment of the present invention pertains to a phosphor sheet, wherein the content of a phosphor is 53 weight % or more of the entire sheet.

Further, another embodiment of the present invention pertains to a phosphor sheet containing at least a silicone resin, a phosphor and silicone fine particles.

In accordance with an embodiment of the present invention, a phosphor sheet having excellent light resistance can be provided. Further, in accordance with another embodiment of the present invention, a phosphor sheet having excellent optical properties and a uniform thickness while containing phosphor particles in a high concentration can be obtained, and an LED light emitting device of high quality, in which there are no irregularities of brightness and color, can be obtained when the phosphor sheet is used as a wavelength-converting sheet of an LED element.

DETAILED DESCRIPTION OF EMBODIMENTS OF THE INVENTION

Figure 1:
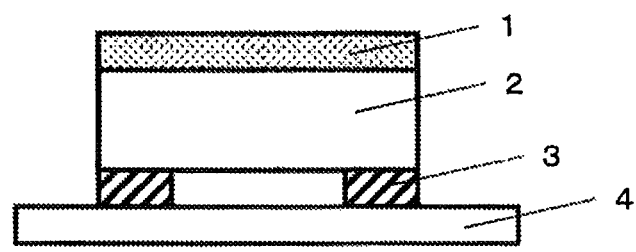
FIG. 1 is a schematic view showing an example of an LED chip of a flip chip type.

In the present invention, a phosphor sheet refers to a sheet containing a phosphor and a resin.

First, light resistance will be described. The light resistance refers to resistance to light generated from an LED chip. The light resistance can be evaluated through reduction in brightness in continuously lighting the LED.

The degradation of an LED is caused since crystal defects are gradually formed within the phosphor or on the surface of the phosphor by light emitted from an LED chip, and therefore the phosphor is optically-degraded. Particularly, in the high-power LED for general lighting uses, since the LED chip has high luminous flux and high brightness, the light degradation of the phosphor is severe, and a life of the LED is a large problem.

One embodiment of the present invention pertains to a phosphor sheet, wherein the content of a phosphor is 53 weight % or more of the entire sheet. Further, the content of a phosphor is preferably 57 weight % or more, and more preferably 60 weight or more of the entire sheet. When the content of a phosphor in the phosphor sheet is set within the above range, the light resistance of the sheet can be enhanced. In addition, an upper limit of the content of a phosphor is not particularly specified, but the content of a phosphor is preferably 95 weight % or less, more preferably 90 weight % or less, furthermore preferably 85 weight % or less, and particularly preferably 80 weight % or less of the entire sheet from the viewpoint of easy production of a sheet which is excellent in workability The content of the phosphor in the phosphor sheet of the present invention can also be determined from a prepared sheet or an LED light emitting device having the sheet mounted thereon. For example, it is possible to distinguish a resin portion from a phosphor particle portion clearly by embedding a phosphor sheet in a resin, cutting the resin, polishing the resulting cross-section to prepare a sample, and observing an exposed cross-section with a scanning electron microscope (SEM). It is possible to measure correctly a volume ratio of the phosphor particles in the entire sheet from an area ratio of particle images in the cross-section. When specific gravities of a resin and a phosphor which compose a sheet are apparent, a weight ratio of the phosphor in the sheet can be calculated by dividing the volume ratio by each specific gravity. When the composition of the resin and the phosphor is not apparent, their composition can be determined by analyzing the cross-section of the phosphor sheet with high resolution micro-infrared spectroscopy or IPC emission spectrometry. When the composition is apparent, since substance-specific specific gravities of the resin and the phosphor can be estimated with a considerable accuracy, a weight ratio can be determined using this estimation. Further, in the case of the LED light emitting device having the phosphor sheet mounted thereon, a weight ratio of the phosphor in the phosphor sheet can be determined by disassembling the LED light emitting device, taking out the phosphor sheet portion, and observing a cross-section by the same technique. Even when a charging ratio at the time of preparing a phosphor sheet is not apparent, by the above-mentioned technique and method or other known analysis method, the weight ratio of the phosphor in the phosphor sheet can be confirmed from a prepared sheet and an LED light emitting device having the sheet mounted thereon.

The phosphor sheet of the present invention is particularly preferably used for uses of a surface cover of the LED as described in detail later. In this case, since the content of the phosphor in the sheet is in the above-mentioned range, an LED light emitting device exhibiting excellent performance can be obtained.

The phosphor sheet of the present invention has excellent light resistance even when its thickness is large because it contains a large amount of a phosphor. On the other hand, from the viewpoint of enhancing the heat resistance of the sheet, the thickness of the sheet is preferably 200 μm or less, more preferably 100 μm or less, and furthermore preferably 50 μm or less.

Composition and a production method of the phosphor sheet according to exemplary embodiments of the present invention will be described below. The phosphor sheet of an embodiment of the present invention contains principally a phosphor and a resin. The phosphor sheet of the present invention may contain other components as required.

(Phosphor)

The phosphor absorbs light emitted from the LED chip, converts the wavelength of the light and emits light different in wavelength from the light of the LED chip. Thereby, a part of light emitted from the LED chip is mixed with a part of light emitted from the phosphor to obtain an LED of multi-color including a white color. Specifically, by optically combining a blue LED with a phosphor which emits light of yellowish emission colors by light from the LED, it is possible to emit white light by using a single LED chip.

The phosphor described above includes various phosphors such as a phosphor emitting green light, a phosphor emitting blue light, a phosphor emitting yellow light, a phosphor emitting red light and the like. Specific examples of the phosphor used in the present invention include known phosphors such as inorganic phosphors, organic phosphors, fluorescent pigments and fluorescent dyes. Examples of the organic phosphors include allylsulfoamide-melamineformaldehyde co-condensation dyes and perylene phosphors, and the perylene phosphors are preferably used since they can be used for the long term. The fluorescent substance particularly preferably used in the present invention includes inorganic phosphors. Hereinafter, the inorganic phosphor used in the present invention will be described.

Examples of the phosphor emitting green light include $SrAl_2O_4$:Eu, $Y_2SiO_5$:Ce, Tb, $MgAl_{11}O_{19}$:Ce,Tb, $Sr_7Al_{12}O_{26}$:Eu, and (at least one of Mg, Ca, Sr and Ba)$Ga_2S_4$: Eu.

Examples of the phosphor emitting blue light include $Sr_5(PO_4)_3$Cl:Eu, $(SrCaBa)_5(PO_4)_3$Cl:Eu, $(BaCa)_5(PO_4)_3$Cl:Eu, (at least one of Mg, Ca, Sr and Ba)$_2B_5O_9$Cl:Eu,Mn, and (at least one of Mg, Ca, Sr and Ba) $(PO_4)_6Cl_2$:Eu,Mn.

Examples of a phosphor emitting green-yellow light include an yttrium-aluminum oxide phosphor activated with at least cerium, an yttrium-gadolinium-aluminum oxide phosphor activated with at least cerium, an yttrium-aluminum-garnet oxide phosphor activated with at least cerium, and an yttrium-gallium-aluminum oxide phosphor activated with at least cerium (so-called YAG-based phosphor). Specifically, $Ln_3M_5O_{12}$:R (Ln is at least one selected from among Y, Gd and La, M includes at least either Al or Ca, and R is a lanthanoid-based phosphor) and $(Y_{1-x}Ga_x)_3(Al_{1-y}Ga_y)_5O_{12}$:R (R is at least one selected from among Ce, Tb, Pr, Sm, Eu, Dy and Ho, and $0<x<0.5$, $0<y<0.5$) can be used.

Examples of the phosphor emitting red light include $Y_2O_2S$:Eu, $La_2O_2S$:Eu, $Y_2O_3$:Eu, and $Gd_2O_2S$:Eu.

Further, examples of the phosphor emitting light compatible with a blue LED which is currently mainstream include YAG-based phosphors such as $Y_3(Al,Ga)_5O_{12}$:Ce, $(Y,Gd)_3Al_5O_{12}$:Ce, $Lu_3Al_5O_{12}$:Ce and $Y_3Al_5O_{12}$:Ce; TAG-based phosphors such as $Tb_3Al_5O_{12}$:Ce; silicate-based phosphors such as $(Ba,Sr)_2SiO_4$:Eu phosphor, $Ca_3Sc_2Si_3O_{12}$:Ce phosphor and $(Sr,Ba,Mg)_2SiO_4$:Eu phosphor; nitride-based phosphors such as $(Ca,Sr)_2Si_5N_8$:Eu, $(Ca,Sr)AlSiN_3$:Eu and $CaSiAlN_3$:Eu; oxynitride-based phosphors such as $Ca_x(Si,Al)_{12}(O,N)_{16}$:Eu; and phosphors such as $(Ba,Sr,Ca)Si_2O_2N_2$:Eu phosphor, $Ca_8MgSi_4O_{16}Cl_2$:Eu phosphor, $SrAl_2O_4$:Eu, and $Sr_4Al_{14}O_{25}$:Eu.

Among these phosphors, YAG-based phosphors, TAG-based phosphors and silicate-based phosphors are preferably used from the viewpoints of luminous efficacy and brightness.

Known phosphors other than the above phosphors can be used according to uses or a desired emission color.

As the phosphor, a particulate phosphor can be preferably used. An average particle size of the phosphor is not particularly limited, but a particle size in which D50 is 0.05 μm or more is preferred, and a particle size in which D50 is 3 μm or more is more preferred. Further, a particle size in which D50 is 30 μm or less is preferred, and a particle size in which D50 is 20 μm or less is more preferred. Herein, in the present invention, the average particle size refers to a median size, namely, D50. D50 of the phosphor contained in the phosphor sheet is measured by a method in which measured images of a sheet cross-section by scanning electron microscope (SEM) are processed by an image analyzer to determine a particle size distribution, and a particle size at which the cumulative percent passing from the smaller particle-size side in the volume based particle size distribution obtained by measuring reaches 50% is determined as a median size D50. The value of D50 determined by this method is smaller than the value obtained by directly observing a phosphor powder, but the average particle size of particles of the phosphor in the present invention is defined as the value determined by the above-mentioned measurement method. When D50 is within the above range, dispersibility of the phosphor in the phosphor sheet is good, and stable light emitting is achieved.

In addition, the reason why the value of D50 is smaller than the value obtained by directly observing a phosphor powder is that a diameter is correctly measured when directly observing a powder, but a phosphor particle is not necessarily cut along its equatorial plane when a cross-section of a phosphor sheet is measured. Assuming that the phosphor particle is spherical and the particle is cut along an arbitrary location, its apparent diameter is theoretically 78.5% of a true diameter (corresponding to a ratio of an area of a circle with a diameter of 1 to an area of a square with a side of 1). Since the phosphor particle is not a true-sphere in practice, the apparent diameter is empirically about 70 to 85% of a true diameter.

(Resin)

The resin used in the present invention is a resin for containing a phosphor therein, and eventually forms the sheet. Accordingly, any resin may be employed as the resin as long as it allows the phosphor to be uniformly dispersed therein and can form a sheet. Specific examples of the resin include a silicone resin, an epoxy resin, a polyallylate resin, a PET modified polyallylate resin, a polycarbonate resin (PC), cyclic olefin, a polyethylene terephthalate resin (PET), a polymethylmethacrylate resin (PMMA), a polypropylene resin (PP), modified acryl (Sunduren manufactured by Kanegafuchi Chemical Industry Co., Ltd.), a polystyrene resin (PE), and an acrylonitrile-styrene copolymer resin (AS). In the present invention, the silicone resin or the epoxy resin is preferably used from the viewpoint of transparency. Furthermore, the silicone resin is particularly preferably used from the viewpoint of heat resistance.

As the silicone resin used in the present invention, a curable silicone rubber is preferred. Any liquid form of a one-component liquid form and two-component liquid form (three-component liquid form) may be employed. A type of the curable silicone rubber includes a type in which a condensation reaction occurs by moisture in the air or a catalyst, and this type includes a dealcoholization type, a deoximation type, an acetic acid elimination type, and a hydroxyamine elimination type. A type in which a hydrosilylation reaction occurs by a catalyst includes an addition reaction type. Any of these types of curable silicone rubbers may be used. Particularly, an addition reaction type silicone rubber is more preferred in that a by-product associated with a curing reaction is not produced, shrinkage by curing is small, and curing can be easily accelerated by heating.

The addition reaction type silicone rubber is formed, as an example, by a hydrosilylation reaction of a compound containing an alkenyl group coupled with a silicon atom with a compound containing a hydrogen atom bound to a silicon atom. Examples of the resin materials described above include compounds formed by a hydrosilylation reaction of a compound containing an alkenyl group bound to a silicon atom, such as vinyltrimethoxysilane, vinyltriethoxysilane, allyltrimethoxysilane, propenyltrimethoxysilane, norbornenyltrimethoxysilane and (octenyl)trimethoxysilane with a compound containing a hydrogen atom bound to a silicon atom, such as methylhydrogenpolysiloxane, dimethylpolysiloxane-CO-methylhydrogenpolysiloxane, ethylhydrogenpolysiloxane and methylhydrogenpolysloxane-CO-methylphenylpolysloxane. Further, other materials, for example, known materials described in Japanese Patent Laid-open Publication No. 2010-159411, can be utilized.

Further, as commercialized products, it is also possible to use a general-use silicone encapsulation material for an LED. Specific examples of such an encapsulation material include OE-6630 A/B and OE-6336 A/B manufactured by Dow Corning Toray Co., Ltd. and SCR-1012 A/B and SCR-1016 A/B manufactured by Shin-Etsu Chemical Co., Ltd.

In the silicone resin composition for preparing a phosphor sheet of the present invention, a hydrosilylation retarder such as acetylene alcohol is preferably blended as the additional component in order to inhibit curing at room temperature, thereby lengthening the pot life. Also, fine particles such as fumed silica, glass powder or quartz powder, an inorganic filler such as titanium oxide, zirconia oxide, barium titanate or zinc oxide, a pigment, a flame retardant, a heat resistant, an antioxidant, a dispersing agent, a solvent, or a tackifier such as a silane coupling agent or a titanium coupling agent may be blended, as required, to the extent of not impairing the effects of the present invention.

In particular, it is preferred to add a polydimethylsiloxane component having a low molecular weight, silicone oil, or the like to a silicone resin composition for preparing a phosphor sheet from the viewpoint of the surface smoothness of the phosphor sheet. Such a component is preferably added in an amount of 100 to 2000 ppm, and more preferably in an amount of 500 to 1000 ppm with respect to the weight of the entire compositions.

In forming the phosphor sheet, a resin liquid containing a phosphor of a material for forming a phosphor sheet is first prepared. However, when the concentration of the phosphor particles in the resin liquid is high, the flowability of the resin liquid is made poor. Thereby, the distribution of phosphor particles in the resulting phosphor sheet becomes nonuniform, and a coating operation is obstructed because of poor flowability and therefore thickness is nonuniform. When the distribution of phosphor particles and the thickness are nonuniform, brightness and a color of white light of a light emitting device using an ultimate LED are nonuniform. In accordance with the present invention, by containing silicone particles, the flowability of a resin liquid is significantly improved and hence the thickness uniformity of the resulting phosphor sheet is largely improved.

Further, another embodiment of the present invention pertains to a phosphor sheet containing a silicone resin, a phosphor and silicone fine particles. Here, the same materials as in the above description are preferably used for the silicone resin and the phosphor. Also, containing of the silicone particles is very preferred in order to raise the concentration of the phosphor in the phosphor sheet.

The silicone fine particles contained in the phosphor sheet of the present invention are preferably fine particles made of a silicone resin and/or a silicone rubber. The particularly preferable fine particles are silicone fine particles obtained by a method of hydrolyzing an organosilane such as organotrialkoxysilane, organodialkoxysilane, organotriacetoxysilane, organodiacetoxysilane, organotrioximesilane, organodioximesilane or the like, and then condensing the resulting hydrolysate.

As the organotrialkoxysilane, methyltrimethoxysilane, methyltriethoxysilane, methyltri-n-propoxysilane, methyltri-i-propoxysilane, methyltri-n-butoxysilane, methyltri-i-butoxysilane, methyltri-s-butoxysilane, methyltri-t-butoxysilane, ethyltrimethoxysilane, n-propyltrimethoxysilane, i-propyltrimethoxysilane, n-butyltributoxysilane, i-butyltributoxysilane, s-butyltributoxysilane, t-butyltributoxysilane, N-β(aminoethyl)γ-aminopropyltrimethoxysilane, γ-glycidoxypropyltrimethoxysilane, vinyltrimethoxysilane, phenyltrimethoxysilane, and the like are exemplified.

As the organodialkoxysilane, dimethyldimethoxysilane, dimethyldiethoxysilane, methylethyldimethoxysilane, methylethyldiethoxysilane, diethyldiethoxysilane, diethyldimethoxysilane, 3-aminopropylmethyldiethoxysilane, N-(2-aminoethyl)-3-aminopropylmethyldimethoxysilane, N-(2-aminoethyl)-3-aminoisobutylmethyldimethoxysilane, N-ethylaminoisobutylmethyldiethoxysilane, (phenylaminomethyl)methyldimethoxysilane, vinylmethyldiethoxysilane, and the like are exemplified.

As the organotriacetoxysilane, methyltriacetoxysilane, ethyltriacetoxysilane, vinyltriacetoxysilane, and the like are exemplified.

As the organodiacetoxysilane, dimethyldiacetoxysilane, methylethyldiacetoxysilane, vinylmethyldiacetoxysilane, vinylethyldiacetoxysilane, and the like are exemplified.

As the organotrioximesilane, methyltrismethylethylketoximesilane, vinyltrismethylethylketoximesilane, are exemplified, and as the organodioximesilane, methylethylbismethylethylketoximesilane, and the like are exemplified.

Such particles can be obtained by using a method described in Japanese Patent Laid-open Publication No. 63-77940, a method described in Japanese Patent Laid-open Publication No. 6-248081, a method described in Japanese Patent Laid-open Publication No. 2003-342370, a method described in Japanese Patent Laid-open Publication No. 4-88022, or the like. Also, a method of obtaining particles by adding an organosilane such as organotrialkoxysilane, organodialkoxysilane, organotriacetoxysilane, organodiacetoxysilane, organotrioximesilane, or organodioximesilane, and/or a partial hydrolysate thereof to an aqueous alkali solution and hydrolyzing and condensing the organosilane and/or the partial hydrolysate, a method of obtaining particles by adding an organosilane and/or a partial hydrolysate thereof to water or an acidic solution, hydrolyzing the organosilane and/or the partial hydrolysate to obtain a partial condensate and adding alkali to allow a condensation reaction to proceed, and a method of obtaining particles by arranging an organosilane and/or a hydrolysate thereof in an upper layer and alkali or a mixed liquid of alkali and an organic solvent in a lower layer separately, and hydrolyzing/polycondensing the organosilane and/or the hydrolysate in the interface between the upper layer and the lower layer are known, and in any method of these methods, the particles used in the present invention can be prepared.

Among these methods, the silicone particles, which are obtained by a method of adding a polymeric dispersing agent to a reaction solution as described in Japanese Patent Laid-open Publication No. 2003-342370, are preferably used when the organosilane and/or the partial hydrolysate is hydrolyzed/condensed to produce spherical organopolysilsesquioxane fine particles.

Also, in the production of the particles, silicone particles, which are produced by hydrolyzing/condensing an organosilane and/or a partial hydrolysate thereof, adding the organosilane and/or the partial hydrolysate to an aqueous acidic solution in the presence of a polymeric dispersing agent and a salt, which function as a protective colloid in a solvent, to obtain a hydrolysate, and adding alkali to allow a condensation reaction to proceed, can be used.

Any of a synthetic polymer and a natural polymer can be used as the polymeric dispersing agent as long as it is a water-soluble polymer, and functions as a protective colloid in a solvent, and specific examples of the polymeric dispersing agent include polyvinylalcohol, polyvinylpyrrolidone, and the like. As a method of adding a polymeric dispersing agent, a method of adding a polymeric dispersing agent to a starting reaction solution in advance, a method of adding a polymeric dispersing agent together with an organotrialkoxysilane and/or a partial hydrolysate thereof, and a method of hydrolyzing and partially condensing an organotrialkoxysilane and/or a partial hydrolysate thereof and adding a polymeric dispersing agent to the organotrialkoxysilane and/or the partial hydrolysate can be exemplified, and any of these methods may be selected. Here, an amount of the added polymeric dispersing agent is preferably in a range of $5 \times 10^{-7}$ to $5 \times 10^{-2}$ parts by weight with respect to 1 part by weight of the reaction liquid. When the amount of the polymeric dispersing agent is within this range, cohesion between the particles hardly takes place.

An organic substituent contained in the silicone fine particles preferably includes a methyl group and a phenyl group, and a refractive index of the silicone fine particles can be adjusted by adjusting the contents of these substituents. When light passing through the silicone resin serving as a binder resin is intended to be used without scattering in order to avoid the reduction of brightness of an LED light emitting device, a refractive index difference between a refractive index d1 of the silicone fine particles and a refractive index d2 of components other than the silicone particles and the phosphor is preferably small. The refractive index difference between a refractive index d1 of the silicone particles and a refractive index d2 of components other than the silicone particles and the phosphor is preferably less than 0.10, and more preferably 0.03 or less. When the refractive index is controlled within this range, reflection and scattering on the interface between the silicone particles and the silicone composition is reduced, the high transparency and light transmittance are achieved, and the brightness of the LED light emitting device is not reduced.

Measurement of the refractive index is performed using an Abbe refractometer, a Pulfrich refractometer, a dipping refractometer, a dipping method, or a minimum deviation angle method. However, the Abbe refractometer is useful in measuring the refractive index of the silicone composition, and the dipping method is useful in measuring the refractive index of the silicone particles.

It is also possible to adjust the refractive index difference by changing the quantitative ratio of materials constituting the silicone particles as a means for controlling the refractive index difference. That is, for example, it is possible to obtain a low refractive index close to 1.4 by adjusting the mixing ratio of the raw materials, that is, methyltrialkoxysilane and phenyltrialkoxysilane, and increasing the constituent ratio of the methyl group, and on the contrary, it is possible to obtain a relatively high refractive index by increasing the constituent ratio of the phenyl group.

In the present invention, an average particle size of the silicone fine particles is represented by a median size (D50), and with respect to a lower limit of the average particle size, the average particle size is preferably 0.01 μm or more, and more preferably 0.05 μm or more. Further, with respect to an upper limit of the average particle size, the average particle size is preferably 2.0 μm or less, and more preferably 1.0 μm or less. When the average particle size is 0.01 μm or more, it is easy to manufacture particles having a controlled particle size, and when the average particle size is 2.0 μm or less, optical properties of the phosphor sheet are excellent. Further, when the average particle size is 0.01 μm or more and 2.0 μm or less, the effect of improving the flowability of a resin liquid for manufacturing a phosphor sheet is adequately achieved. Further, monodispersed particles of true-sphere form are preferably used. In the present invention, the average particle size, that is, the median size (D50), and the particle size distribution of the silicone fine particles can be measured through observation by SEM. Measured images by SEM are processed by an image analyzer to determine a particle size distribution, and a particle size at which the cumulative percent passing from the smaller particle-size side in the particle size distribution obtained by measuring reaches 50% is determined as a median size D50. According to this method, it is also possible that as with the method of determining an average particle size of silicone fine particles themselves, after forming a phosphor sheet containing silicone particles, cross-section of the sheet is observed by SEM to determine a particle size distribution of the silicone fine particles, and a particle size at which the cumulative percent passing from the smaller particle-size side in the volume based particle size distribution obtained by measuring reaches 50% is determined as a median size D50. Also in this case, as with the phosphor particles, the average particle size of the silicone fine particles determined from the SEM images of the cross-section of the phosphor sheet is theoretically 78.5% of a true average particle size, and actually about 70% to 85% of the true average particle size.

The content of the silicone fine particles is preferably 1 part by weight or more, and more preferably 2 parts by weight or more with respect to 100 parts by weight of the silicone resin. Also, the content of the silicone fine particles is preferably 20 parts by weight or less, and more preferably 10 parts by weight or less with respect to 100 parts by weight of the silicone resin. When the phosphor sheet contains the silicone fine particles in an amount of 1 part by weight or more, the particularly excellent effect of stabilizing phosphor dispersion is achieved, and on the other hand, when the phosphor sheet contains the silicone fine particles in an amount of 20 parts by weight or less, viscosity of a silicone composition is not excessively increased.

It is a more preferable embodiment of the present invention that the content of the phosphor particles in the phosphor sheet containing a silicone resin, a phosphor and silicone fine particles is 53 weight % or more of the entire phosphor sheet. The content of the phosphor particles is preferably 57 weight % or more, and more preferably 60 weight % or more of the entire phosphor sheet. Also, an upper limit of the content of the phosphor particles is not particularly limited, but the content is preferably 95 weight % or less, more preferably 90 weight % or less, furthermore preferably 85 weight % or less, and particularly preferably 80 weight % or less of the entire phosphor sheet.

Moreover, the contents which are common to the phosphor sheet in general of the present invention will be described below.

The thickness of the phosphor sheet of the present invention refers to a thickness (average thickness) measured according to JIS K 7130 (1999) "Plastics—Film and sheeting—Determination of thickness by mechanical scanning (A)". Further, the thickness is expressed by a value obtained by rounding a number below the tens unless otherwise specified.

The environment of the LED is an environment in which a large amount of heat is generated in a small space, and particularly in the case of a high power LED, heat generation is remarkable. A temperature of the phosphor is raised by such heat generation and hence the luminance of the LED is reduced. Therefore, it is important how to release the generated heat with efficiency. In the present invention, a sheet having excellent heat resistance can be attained by setting a thickness of a sheet to the above-mentioned range. Further, when the sheet thickness varies, there are differences in the amount of the phosphor among the LED chips, and consequently variations in emission spectrum (color temperature, brightness, chromaticity) are caused. Accordingly, a sheet thickness variation is preferably within a range of plus or minus 5%, and more preferably within a range of plus or minus 3%. In addition, the sheet thickness variation referred to herein is determined by measuring a thickness according to JIS K 7130 (1999) "Plastics—Film and sheeting—Determination of thickness by mechanical scanning (A)", and calculating from the following equation.

More specifically, using measurement conditions of "Determination of thickness by mechanical scanning (A)", a thickness is measured with a commercially available micrometer such as a contact type thickness measurement apparatus, a difference between a maximum value or a minimum value and the average thickness of the resulting thickness is calculated, and a ratio expressed in percentage of the calculated value divided by the average thickness is a thickness variation B (%).

Thickness variation $B$ (%)={(maximum thickness deviation*−average thickness)/average thickness}×100

* As a maximum thickness deviation, of the differences in the thickness between the maximum value and the average value, and between the minimum value and the average value, a larger difference is selected.

(Preparation Method of Sheet)

An exemplary method for preparing a phosphor sheet of the present invention will be described. In addition, the following description is just an example, and the method for preparing a phosphor sheet is not limited to this. First, a solution in which a phosphor is dispersed in a resin (hereinafter, referred to as a "resin solution for preparing a sheet") is prepared as a coating solution for forming a sheet. The resin solution for preparing a sheet is obtained by mixing a phosphor and a resin in an appropriate solvent. In the case of using an addition reaction type silicone resin, a curing reaction can be initiated even at room temperature if a compound containing an alkenyl group coupled with a silicon atom is mixed with a compound containing a hydrogen atom coupled with a silicon atom. Then, a hydrosilylation retarder such as an acetylene compound can also be further compounded with the resin solution for preparing a sheet to extend a pot life. It is also possible to mix a dispersing agent or a leveling agent for stabilizing a coating film as an additive, or an adhesion aid such as a silane coupling agent as a modifier of a sheet surface in the resin solution for preparing a sheet. Further, it is also possible to mix silicone fine particles or other inorganic particles such as silica or alumina in the resin solution for preparing a sheet.

When it is necessary to add a solvent in order to adjust viscosity, a type of the solvent is not particularly limited as long as it can adjust the viscosity of a fluent resin. Examples of the solvent include toluene, methyl ethyl ketone, methyl isobutyl ketone, hexane, heptane, cyclohexane, acetone, terpineol, butyl carbitol, butyl carbitol acetate, glyme, diglyme and the like.

These components are blended so as to have a predetermined composition, and then the resulting mixture is uniformly mixed/dispersed with a mixer/kneader such as a homogenizer, a rotation-revolution mixer, a 3-roll mill, a ball mill, a planetary ball mill or a beads mill to obtain a resin solution for preparing a sheet. After mixing/dispersing, or in the process of mixing/dispersing, deaeration is also preferably performed in a vacuum or under a reduced pressure.

Next, the resin solution for preparing a sheet is applied onto a substrate, and dried. The application can be performed by using a reverse roll coater, a blade coater, a slit die coater, a direct gravure coater, an offset gravure coater, a reverse roll coater, a blade coater, a kiss coater, screen printing, a natural roll coater, an air knife coater, a roll blade coater, a baribar roll blade coater, a two stream coater, a rod coater, a wire bar coater, a coating applicator, a dip coater, a curtain coater, a spin coater, a knife coater, In order to achieve uniformity of the thickness of the sheet, the resin solution for preparing a sheet is preferably applied with a slit die coater. Further, the phosphor sheet of the present invention can also be prepared by using a printing method such as screen printing, gravure printing, planographic printing or the like. Particularly, screen printing is preferably used.

As the substrate to be used for preparation of a sheet, known metal, film, glass, ceramic, paper or the like can be used. Specific examples of the substrate include a plate or a foil of metal such as aluminum (including aluminum alloy), zinc, copper and iron; a film made of plastic such as cellulose acetate, polyethylene terephthalate (PET), polyethylene, polyester, polyamide, polyimide, polystyrene, polypropylene, polycarbonate, polyvinyl acetal, aramid and polyphenylene sulfide; and paper having plastic (polyethylene, polypropylene, polystyrene, or the like) laminated thereon or paper coated with plastic (polyethylene, polypropylene, polystyrene, or the like), paper or a plastic film having the above-mentioned metal laminated thereon or vapor-deposited thereon. Among these materials, a PET film is preferred from the viewpoint of economic efficiency and handling. When an elevated temperature is required in curing a resin, a polyimide film is preferred from the viewpoint of heat resistance. The substrate may be previously subjected to release treatment of a surface for ease of releasing a sheet. Further, when the substrate is a metal plate, the plate surface may be subjected to chrome- or nickel-plating or ceramic treatment.

The thickness of the substrate is not particularly limited, but a lower limit is preferably 40 µm or more, and more preferably 60 µm or more. Also, an upper limit is preferably 5000 µm or less, and more preferably 3000 µm or less.

A sheet can be dried by using a common heating apparatus such as a hot air drier, an infrared drier or the like. A common heating apparatus such as a hot air drier, an infrared drier or the like is used for thermally curing the sheet. In this case, thermally curing is usually performed under the conditions of a temperature of 40 to 250° C. and a heating time of 1 minute to 5 hours, and preferably under the conditions of a temperature of 100° C. to 200° C. and a heating time of 2 minutes to 3 hours.

A pressure sensitive adhesive layer may be disposed on the sheet in order to enhance the adhesive property to an LED chip. A material of the pressure sensitive adhesive layer is not particularly limited, and examples thereof include common rubber-based, acryl-based, urethane-based, and silicone-based pressure sensitive adhesives. Any pressure sensitive adhesive may be used, but the silicone-based pressure sensitive adhesive is useful as a pressure sensitive adhesive suitable for heat resistance, an insulating property and transparency.

The protective film may be disposed on the sheet. A material of the protective film is not particularly limited, and examples thereof include a film made of plastic such as cellulose acetate, polyethylene terephthalate (PET), polyethylene, polyester, polyamide, polyimide, polystyrene, polypropylene, polycarbonate, polyvinyl acetal; aramid and polyphenylene sulfide; and paper having plastic (polyethylene, polypropylene, polystyrene, and the like) laminated thereon or paper coated with plastic (polyethylene, polypropylene, polystyrene, or the like), and paper or a plastic film having the above-mentioned metal laminated thereon or vapor-deposited thereon. Further, the protective film may be subjected to releasing treatment by a known release agent such as a silicone-based release agent or a fluorine-based release agent.

An LED chip to which the phosphor sheet of the present invention can be applied includes a face up type LED chip and a flip chip type LED chip, and particularly preferable one is a flip chip type LED chip. The flip chip type LED chip has high luminous efficacy and a high heat-releasing property. Accordingly, it becomes easy to prepare a high-power LED having excellent light resistance for general lighting uses by employing the phosphor sheet of the present invention.

A method for manufacturing an LED light emitting device by using the phosphor sheet of the present invention will be described. In addition, the following description is just an example, and the manufacturing method is not limited to this description. When the phosphor sheet of the present invention is applied to the flip chip type LED chip, first, the phosphor sheet is formed into a small chip in conformity to a size of the LED chip. Formation into a small chip can be performed by dicing. When the phosphor sheet has a protective film, the phosphor sheet may be formed into a small chip after peeling the protective film, or may be formed into a small chip together with the protective film.

Next, after peeling a protective film if having the protective film, the sheet formed into a small chip is bonded to a surface (outcoupling surface) on the side opposite to the surface having an electrode formed thereon of the LED chip. At this time, the phosphor sheet may be in a semi-cured state or may be previously cured. It is preferred to use an adhesive in bonding phosphor sheet, and known die bonding agents or adhesives, such as acrylic resin-based, epoxy resin-based, urethane resin-based, silicone resin-based, modified silicone resin-based, phenol resin-based, polyimide-based, polyvinyl alcohol-based, polymethacrylate resin-based, melamine resin-based and urea resin-based adhesives, can be used. When the phosphor sheet has a pressure sensitive adhesive, the phosphor sheet may use the pressure sensitive adhesive for bonding. When the phosphor sheet is a semi-cured sheet, curing by heating may be employed. Further, when the phosphor sheet has a thermosoftening property after curing, the phosphor sheet can also be bonded by thermal fusion bonding.

Thereafter, an electrode of the LED chip is electrically connected to a wire of a circuit board by a known method, and thus a light emitting device can be attained. When the LED chip has an electrode on a side of a light emitting surface side, the LED chip is fixed to the circuit board by a die bonding material with the light emitting surface faced upward, and then the electrode on the top surface of the LED chip is connected to the wire of the circuit board by wire bonding. Further, when the LED chip is a flip chip type in which an electrode pad is disposed on the surface opposite to the light emitting surface, an electrode surface of the LED chip is opposed to the wire of the circuit board and connected to the wire by gang bonding.

When the phosphor sheet is bonded to the LED chip in a semi-cured state, the semi-cured phosphor sheet can be cured at a preferred timing before or after this electrical connection. For example, when the flip chip type LED chip is bonded by thermocompression bonding in bonding the LED chip by gang bonding, the phosphor sheet may be simultaneously cured by this heating. Further, when a package, in which the LED chip is connected to the circuit board, is surface mounted on a larger circuit board, by solder reflow, the phosphor sheet may be cured concurrently with soldering.

When the phosphor sheet is bonded to the LED chip in a cured state, it is not necessary to provide a curing process after bonding the sheet to the LED chip. The case where the phosphor sheet is bonded to the LED chip in a cured state corresponds to the case where a cured phosphor sheet has an adhesive layer separately or the case where the phosphor sheet has thermal adhesiveness after curing.

The phosphor sheet may also serve as an encapsulation material of the LED chip, and the LED chip having the phosphor sheet bonded thereto can also be further encapsulated by using a known silicone resin as a transparent encapsulation material. Further, after the LED chip is encapsulated with a transparent encapsulation material, the phosphor sheet can also be bonded to the encapsulation material for use.

When the phosphor sheet is applied to the face up type LED chip, as with the above-mentioned description, the phosphor sheet is formed into a small chip, and then the phosphor sheet formed into a small chip is bonded to an outcoupling surface of the LED chip. When the phosphor sheet is in a semi-cured state, the sheet is cured after bonding the sheet. Here, in the face up type LED chip, at least one electrode is formed on the outcoupling surface, and electrical continuity is obtained from the electrode by wire bonding as described later. Therefore, the phosphor sheet is bonded in such a way that at least a part of the electrode is exposed. As a matter of course, the phosphor sheet may be bonded to only an outcoupling part. In this case, the phosphor sheet can be patterned so as to expose a part of the electrode.

Thereafter, the surface opposite to the outcoupling surface of the LED chip is fixed to the circuit board, and the LED chip is electrically connected to the circuit board by a known method such as wire bonding, and thus a light emitting device can be obtained.

As other modification example, a phosphor sheet formed into a small chip may be bonded to the LED chip mounted on a substrate. On the contrary, a plurality of LED chips are bonded to the phosphor sheet, and then the sheet may be cut into small chips for every LED chip with a sheet by dicing the LED chip. Further, a phosphor sheet not formed into a small chip is bonded to a semiconductor wafer on which LED chips are made, and then the semiconductor wafer and the phosphor sheet can also be collectively singulated (diced).

A light emitting device, to which an LED chip obtained by using the phosphor sheet of the present invention can be applied, is not particularly limited, and it can be widely applied to backlights for displays used for TV set, personal computer, mobile phone, game machine, and the like, lighting in automotive applications such as headlight, and general lighting.

EXAMPLES

Hereinafter, the present invention will be described in more detail by way of examples. However, the present invention is not limited to these examples.

<Measurement of Average Particle Size>

Average particle sizes of synthesized silicone fine particles and purchased phosphor particles were determined by measuring a cross-section of a sample of each phosphor sheet by a scanning electron microscope (SEM) and calculating the measured image. The cross-section of the phosphor sheet was observed with a scanning electron microscope (high resolution field emission scanning electron microscope S-4800 manufactured by Hitachi High-Technologies Corporation). The observed image was processed and analyzed by using an analysis software (Image version 6.2) to determine a particle diameter distribution. A particle size at which the cumulative percent passing from the smaller particle-size side in the particle diameter distribution reaches 50% was determined as a median size D50.

<Measurement of Correlated Color Temperature and Brightness, and Light Resistance Test>

An electric current of 400 mA was applied to a light emitting device in which each phosphor sheet was mounted on a blue LED element to light up an LED chip, and a correlated color temperature and brightness were measured immediately after starting a test using an instantaneous multiple photometric system (MCPD-3000, manufactured by Otsuka Electronics Co., Ltd.). One hundred LED light emitting devices were prepared for every one kind of each phosphor sheet, an average value, a maximum value and a minimum value of the 100 devices were determined, and variations were calculated and evaluated from the following formulas.

Correlated color temperature variation ($K$)=correlated color temperature maximum deviation*−average correlated color temperature

* As a correlated color temperature maximum deviation, of the differences in the correlated color temperature between the maximum value and the average value, and between the minimum value and the average value, a larger difference is selected.

Brightness variation (cd/m$^2$)=brightness maximum deviation*−average brightness

* As a brightness maximum deviation, of the differences in the brightness between the maximum value and the average value, and between the minimum value and the average value, a larger difference is selected.

Thereafter, each light emitting device was left standing with the LED chip lit, brightness after a lapse of 300 hours was measured in the same manner, and brightness retention was calculated from the following formula to rate light resistance according to the following criteria. This indicates that when the brightness retention is higher, the light resistance is more excellent. A device rated as rank B or higher has no problems in practical use, and a device rated as rank A is superior in practical use.

Bright retention $I$ (%)=(brightness after a lapse of 300 hours/brightness immediately after start of test)×100

(rounding off the first decimal place)

S: retention 95% or more—very good in light resistance
A: retention 90 to 94%—good light resistance
B: retention 80 to 89%—no problem in practical use with light resistance
C: retention 50 to 79%—bad light resistance
D: retention 49% or less—significantly bad light resistance <Heat Resistance Test>

An electric current was applied to a light emitting device using each phosphor sheet so that a surface temperature of an LED is room temperature (25° C.) to 170° C. to light up an LED chip, and brightness was measured using an instantaneous multiple photometric system (MCPD-3000, manufactured by Otsuka Electronics Co., Ltd.). The brightness was measured when the LED surface temperature was room temperature (25° C.) and 170° C., and brightness retention was calculated from the following formula to rate heat resistance according to the following criteria. This indicates that when the brightness retention is higher, the heat resistance is more excellent. A device rated as rank B or higher has no problems in practical use, and a device rated as rank A is superior in practical use.

Bright retention $II$ (%)=(brightness at surface temperature of 170° C./brightness at surface temperature of room temperature (25° C.))×100

(rounding off the first decimal place)

S: retention 90% or more—very good in heat resistance
A: retention 81 to 89%—good heat resistance
B: retention 51 to 80%—no problem in practical use with heat resistance
C: retention 50% or less—bad heat resistance <Measurement of Thickness>

A thickness of a predetermined position of a mold release PET film ("Cerapeel" BLK: manufactured by Toray Advanced Film Co., Ltd.) for preparing a phosphor sheet was previously measured with a micrometer, and the position was marked. After preparing the phosphor sheet, the thickness of the marked position was measured again with a micrometer, and the thickness of the phosphor sheet was obtained by subtracting the thickness of the mold release PET film previously measured from the resulting thickness. The thickness was measured at 100 points located at grid point spaced 10 mm apart in a sheet 110 mm square as a sample to determine a maximum value, a minimum value and an average value of each sample, and a thickness variation B was calculated using the following formula.

Thickness variation $B$ (%)={(maximum thickness deviation*−average thickness)/average thickness}×100

* As a maximum thickness deviation, of the differences in the thickness between the maximum value and the average value, and between the minimum value and the average value, a larger difference is selected.

(Synthesis of Silicone Fine Particles)

<Silicone Fine Particles 1>

A 2-liter four-necked round flask was equipped with a stirrer, a thermometer, a reflux tube and a dropping funnel, 2 L of 2.5% ammonia water containing 1 ppm of polyether-modified siloxane "BYK333" as a surfactant was put in the flask, and the temperature of the ammonia water was raised in an oil bath while stirring at 300 rpm. After the internal temperature reached 50° C., 200 g of a mixture (23 mol %:77 mol %) of methyltrimethoxysilane and phenyltrimethoxysilane was added dropwise from a dropping funnel over 30 minutes. After continuing to stir the resulting mixture for 60 minutes at that temperature, about 5 g of acetic acid (special grade chemicals) was added, stirred and mixed, and then filtered. 600 ml of water was added twice to particles produced on a filter, 200 ml of methanol was added once to the particles and filtered, and the particles were washed. A cake on the filter was taken out, pounded down, and freeze-dried over 10 hours to obtain 60 g of a white powder. The obtained particles were found to be monodispersed spherical fine particles through observation by SEM. A refractive index of the fine particles was measured by a dipping method, and consequently the refractive index was 1.54. The particles were observed by a cross-sectional transmission electron microscopy (TEM), and consequently it was verified that the particles have a single structure therein.

<Silicone Fine Particles 2>

A 2-liter four-necked round flask was equipped with a stirrer, a thermometer, a reflux tube and a dropping funnel, 2 L of 2.5% ammonia water containing 7 ppm of polyether-modified siloxane "BYK333" as a surfactant was put in the flask, and a temperature of the ammonia water was raised in an oil bath while stirring at 300 rpm. After the internal temperature reached 50° C., 200 g of a mixture (23 mol %:77 mol %) of methyltrimethoxysilane and phenyltrimethoxysilane was added dropwise from a dropping funnel over 30 minutes. After continuing to stir the resulting mixture for 60 minutes at that temperature, about 5 g of acetic acid (special grade chemicals) was added, stirred and mixed, and then filtered. 600 ml of water was added twice to particles produced on a filter, 200 ml of methanol was added once to the particles and filtered, and the particles were washed. A cake on the filter was taken out, pounded down, and freeze-dried over 10 hours to obtain 40 g of a white powder. The obtained particles were found to be monodispersed spherical fine particles through observation by SEM. A refractive index of the fine particles was measured by a dipping method, and consequently the refractive index was 1.54. The particles were observed by a cross-sectional transmission electron microscopy (TEM), and consequently it was verified that the particles have a single structure therein.

<Silicone Fine Particles 3>

A 1-liter four-necked round flask was equipped with stirrer, a thermometer, a reflux tube and a dropping funnel, 600 g of an aqueous sodium hydroxide solution with a pH of 12.5 (25° C.) was put in the flask, and the temperature of the aqueous solution was raised in an oil bath while stirring at 300 rpm. After the internal temperature reached 50° C., 60 g of a mixture (23 mol %:77 mol %) of methyltrimethoxysilane and phenyltrimethoxysilane was added dropwise from a dropping funnel over 20 minutes. After continuing to stir the resulting mixture for 30 minutes at that temperature, 16.5 g of a 10% aqueous acetic acid solution was added as a neutralizing agent, stirred and mixed, and then filtered. 300 ml of water was added thrice to particles produced on a filter, 200 ml of methanol was added once to the particles and filtered, and the particles were washed. A cake on the filter was taken out, and dried at 150° C. for 2 hours to obtain 15 g of a white powder. The obtained particles were found to be monodispersed spherical fine particles through observation by SEM. A refractive index of the fine particles was measured by a dipping method, and consequently the refractive index was 1.54. The particles were observed by a cross-sectional transmission electron microscopy (TEM), and consequently it was verified that the particles have a single structure therein.

<Silicone Fine Particles 4>

A 2-liter four-necked round flask was equipped with a stirrer, a thermometer, a reflux tube and a dropping funnel, 2 L of 2.5% ammonia water was put in the flask, and the temperature of the ammonia water was raised in an oil bath while stirring at 300 rpm. After the internal temperature reached 50° C., 200 g of a mixture (23 mol %:77 mol %) of methyltrimethoxysilane and phenyltrimethoxysilane was added dropwise from a dropping funnel over 30 minutes. After continuing to stir the resulting mixture for 60 minutes at that temperature, about 5 g of acetic acid (special grade chemicals) was added, stirred and mixed, and then filtered. 600 ml of water was added twice to particles produced on a filter, 200 ml of methanol was added once to the particles and filtered, and the particles were washed. A cake on the filter was taken out, pounded down, and freeze-dried over 10 hours to obtain 80 g of a white powder. The obtained particles were found to be monodispersed spherical fine particles through observation by SEM. A refractive index of the fine particles was measured by a dipping method, and consequently the refractive index was 1.54. The particles were observed by a cross-sectional transmission electron microscopy (TEM), and consequently it was verified that the particles have a single structure therein.

<Silicone Fine Particles 5>

A 1-liter four-necked round flask was equipped with a stirrer, a thermometer, a reflux tube and a dropping funnel, 600 g of an aqueous sodium hydroxide solution with a pH of 12.5 (25° C.) was put in the flask, and the temperature of the aqueous solution was raised in an oil bath while stirring at 200 rpm. After the internal temperature reached 50° C., 60 g of a mixture (23 mol %:77 mol %) of methyltrimethoxysilane and phenyltrimethoxysilane was added dropwise from a dropping funnel over 20 minutes. After continuing to stir the resulting mixture for 30 minutes at that temperature, 16.5 g of a 10% aqueous acetic acid solution was added as a neutralizing agent, stirred and mixed, and then filtered. 300 ml of water was added thrice to particles produced on a filter, 200 ml of methanol was added once to the particles and filtered, and the particles were washed. A cake on the filter was taken out, and dried at 150° C. for 2 hours to obtain 10 g of a white powder. The obtained particles were found to be monodispersed spherical fine particles through observation by SEM. A refractive index of the fine particles was measured by a dipping method, and consequently the refractive index was 1.52. The particles were observed by a cross-sectional transmission electron microscopy (TEM), and consequently it was verified that the particles have a single structure therein.

<Silicone Fine Particles 6>

A 2-liter four-necked round flask was equipped with a stirrer, a thermometer, a reflux tube and a dropping funnel, 2 L of 2.5% ammonia water containing 1 ppm of polyether-modified siloxane "BYK333" as a surfactant was put in the flask, and the temperature of the ammonia water was raised in an oil bath while stirring at 300 rpm. After the internal temperature reached 50° C., 200 g of methyltrimethoxysilane was added dropwise from a dropping funnel over 30 minutes. After continuing to stir the resulting mixture for 60 minutes at that temperature, about 5 g of acetic acid (special grade chemicals) was added, stirred and mixed, and then filtered. 600 ml of water was added twice to particles produced on a filter, 200 ml of methanol was added once to the particles and filtered, and the particles were washed. A cake on the filter was taken out, pounded down, and freeze-dried over 10 hours to obtain 60 g of a white powder. The obtained particles were found to be monodispersed spherical fine particles through observation by SEM. A refractive index of the fine particles was measured by a dipping method, and consequently the refractive index was 1.46. The particles were observed by a cross-sectional transmission electron microscopy (TEM), and consequently it was verified that the particles have a single structure therein.

<Silicone Fine Particles 7>

A 2-liter four-necked round flask was equipped with a stirrer, a thermometer, a reflux tube and a dropping funnel, 2 L of 2.5% ammonia water containing 1 ppm of polyether-modified siloxane "BYK333" as a surfactant was put in the flask, and the temperature of the ammonia water was raised in an oil bath while stirring at 300 rpm. After the internal temperature reached 50° C., 200 g of a mixture (25 mol %:75 mol %) of methyltrimethoxysilane and phenyltrimethoxysilane was added dropwise from a dropping funnel over 30 minutes. After continuing to stir the resulting mixture for 60 minutes at that temperature, about 5 g of acetic acid (special grade chemicals) was added, stirred and mixed, and then filtered. 600 ml of water was added twice to particles produced on a filter, 200 ml of methanol was added once to the particles and filtered, and the particles were washed. A cake on the filter was taken out, pounded down, and freeze-dried over 10 hours to obtain 60 g of a white powder. The obtained particles were found to be monodispersed spherical fine particles through observation by SEM. A refractive index of the fine particles was measured by a dipping method, and consequently the refractive index was 1.52. The particles were observed by a cross-sectional transmission electron microscopy (TEM), and consequently it was verified that the particles have a single structure therein.

<Silicone Fine Particles 8>

A 2-liter four-necked round flask was equipped with a stirrer, a thermometer, a reflux tube and a dropping funnel, 2 L of 2.5% ammonia water containing 1 ppm of polyether-modified siloxane "BYK333" as a surfactant was put in the flask, and the temperature of the ammonia water was raised in an oil bath while stirring at 300 rpm. After the internal temperature reached 50° C., 200 g of a mixture (80 mol %:20 mol %) of methyltrimethoxysilane and phenyltrimethoxysilane was added dropwise from a dropping funnel over 30 minutes. After continuing to stir the resulting mixture for 60 minutes at that temperature, about 5 g of acetic acid (special grade chemicals) was added, stirred and mixed, and then filtrated. 600 ml of water was added twice to particles produced on a filter, 200 ml of methanol was added once to the particles and filtered, and the particles were washed. A cake on the filter was taken out, pounded down, and freeze-dried over 10 hours to obtain 60 g of a white powder. The obtained particles were found to be monodispersed spherical fine particles through observation by SEM. A refractive index of the fine particles was measured by a dipping method, and consequently the refractive index was 1.57. The particles were observed by a cross-sectional transmission electron microscopy (TEM), and consequently it was verified that the particles have a single structure therein.

Example 1

Using a 300 ml polyethylene container, 47% by weight of "OE-6630 A/B" (manufactured by Dow Corning Toray Co., Ltd.) as a silicone resin and 53% by weight of "NYAG-02" (manufactured by Internatix Corporation: YAG-based phosphor doped with Ce, specific gravity: 4.8 g/cm$^3$, D50: 7 μm) as a phosphor were mixed.

Thereafter, the resultant was stirred and deaerated at 1000 rpm for 20 minutes by using a planetary mixer/deaerator "MAZERUSTAR KK-400" (manufactured by KURABO INDUSTRIES LTD.) to obtain a resin solution for preparing a sheet. The resin solution for preparing a sheet was applied onto "Cerapeel" BLK (manufactured by Toray Advanced Film Co., Ltd.) by use of a slit die coater, heated at 130° C. for 2 hours, and dried to obtain a phosphor sheet having an average thickness of 200 μm. Thereafter, the phosphor sheet was cut into small pieces 1 mm square by a dicing apparatus. Moreover, a die bonding paste "EN-4900GC" (manufactured by Hitachi Chemical Co., Ltd.) was applied onto the phosphor sheet cut into small pieces, and then the phosphor sheet was arranged and attached in such a way that the sheet surface having the die bonding paste applied thereon is brought into contact with a chip surface of a substrate having a flip chip type blue LED chip 1 mm square mounted thereon. The resulting sheet was heated at 100° C. for 1 minute on a hot plate to cure the die bonding paste. "OE-6630 A/B" (manufactured by Dow Corning Toray Co., Ltd.) was used as an encapsulation material for encapsulating the sheet to obtain a light emitting device (FIG. 1). The above-mentioned light resistance test was performed on the obtained light emitting device and consequently brightness retention I (%) was 88%, and the result which had no problems in practical use was obtained (Table 1). Further, the above-mentioned heat resistance test was performed and consequently brightness retention II (%) was 83%, and a good result was obtained (Table 1).

Examples 2 to 4

Effect of Sheet Thickness

Each resin was prepared, and evaluated by following the same operations as in Example 1 except for changing the sheet thickness to values shown in Table 1. The results are shown in Table 1. It was found from these Examples that when the sheet thickness is 200 μm or less, it is possible to pursue good light resistance and good heat resistance simultaneously.

Examples 5 to 10

Effect of Phosphor Content

Each phosphor sheet was prepared and evaluated by following the same operations as in Example 1 except for changing the phosphor content to values shown in Table 1. The results are shown in Table 1. Both of the light resistance test and the heat resistance test showed good results, and particularly in the heat resistance test, very good results were obtained. It was found from these Examples that when the content of a phosphor is 57 weight % or more of the entire sheet, the phosphor sheet is more excellent in light resistance, and when the content is 60 weight or more of the entire sheet, the phosphor sheet is particularly excellent in light resistance.

Example 11

Change of Silicone Resin

A phosphor sheet was prepared and evaluated by following the same operations as in Example 5 except for changing the silicone resin to "OE-6336 A/B" (manufactured by Dow Corning Toray Co., Ltd.). The results are shown in Table 1. The light resistance test showed the result which had no problems in practical use, and the heat resistance test showed a very good result.

Example 12

Change of Silicone Resin

A phosphor sheet was prepared and evaluated by following the same operations as in Example 8 except for changing the silicone resin to "OE-6336 A/B" (manufactured by Dow Corning Toray Co., Ltd.). The results are shown in Table 1. Both of the light resistance test and the heat resistance test showed very good results.

Comparative Examples 1 to 4

Each phosphor sheet was prepared and evaluated by following the same operations as in Example 1 except for changing the phosphor content and the sheet thickness, respectively, to values shown in Table 2. The results are shown in Table 2. Each light resistance test showed an inadequate result.

Example 13

Change of Inorganic Phosphor

A phosphor sheet was prepared and evaluated by following the same operations as in Example 8 except for changing the inorganic phosphor to "R6634" (manufactured by Internatix Corporation: nitride-based phosphor, specific gravity: 3.0 g/cm$^3$, D50: 15.5 μm). The results are shown in Table 3. Both of the light resistance test and the heat resistance test showed very good results.

Example 14

Change of Inorganic Phosphor

A phosphor sheet was prepared and evaluated by following the same operations as in Example 8 except for changing the inorganic phosphor to "G2060" (manufactured by Internatix Corporation: silicate-based phosphor doped with Eu, specific gravity: 5.1 g/cm$^3$, D50: 15.5 μm). The results are shown in Table 3. Both of the light resistance test and the heat resistance test showed very good results.

Example 15

Change of Inorganic Phosphor

A phosphor sheet was prepared and evaluated by following the same operations as in Example 8 except for changing the inorganic phosphor to "EY4254" (manufactured by Internatix Corporation: silicate-based phosphor doped with Eu, specific gravity: 4.71 g/cm$^3$, D50: 15.5 μm). The results are shown in Table 3. Both of the light resistance test and the heat resistance test showed very good results.

Examples 16 to 19

Change of Blue LED Chip and Effect of Phosphor Content

Figure 2:
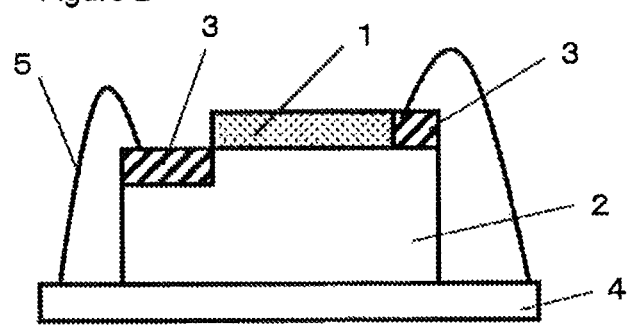
FIG. 2 is a schematic view showing an example of an LED chip of a face up type.

Each phosphor sheet was prepared by following the same operations as in Example 1 except for changing the phosphor content and the sheet thickness, respectively, to values shown in Table 3, and then the prepared phosphor sheet was cut into small pieces 1 mm square by a dicing apparatus. Moreover, a die bonding paste "EN-4270K2" (manufactured by Hitachi Chemical Co., Ltd.) was applied onto the phosphor sheet cut into small pieces, and then the phosphor sheet was arranged and attached in such a way that the sheet surface having the die bonding paste applied thereon is brought into contact with a chip surface of a substrate having a face up type blue LED chip 1 mm square mounted thereon. The resulting sheet was heated at 100° C. for 1 minute on a hot plate to cure the die bonding paste. "OE-6630 A/B" (manufactured by Dow Corning Toray Co., Ltd.) was used as an encapsulation material for encapsulating the sheet to obtain a light emitting device (FIG. 2). The above-mentioned light resistance test and heat resistance test were performed on the obtained light emitting device, and the results of the tests are shown in Table 3. In all phosphor sheets, both of the light resistance test and the heat resistance test showed the results which had no problems in practical use or better results than this, and particularly in the heat resistance test, very good results were obtained. It was found from these Examples that when the content of a phosphor is 57 weight or more of the entire sheet, the phosphor sheet is more excellent in light resistance, and when the content is 60 weight % or more of the entire sheet, the phosphor sheet is particularly excellent in light resistance.

Examples 20 to 23

Change of Blue LED Chip and Effect of Phosphor Content

Figure 3:
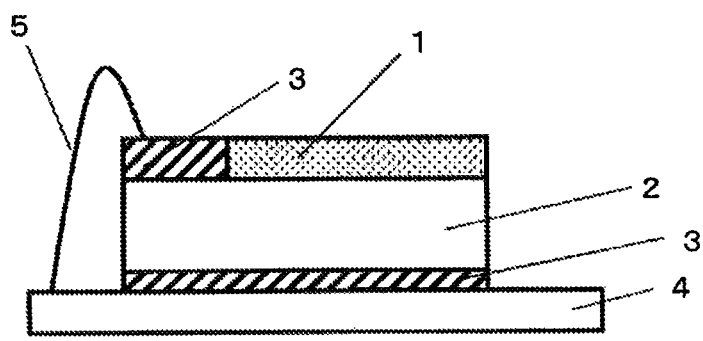
FIG. 3 is a schematic view showing an example of an LED chip of a face up type.

Each phosphor sheet was prepared by following the same operations as in Example 1 except for changing the phosphor content and the sheet thickness, respectively, to values shown in Table 3, and then the prepared phosphor sheet was cut into small pieces 1 mm square by a dicing apparatus. Moreover, a die bonding paste "EN-4270K2" (manufactured by Hitachi Chemical Co., Ltd.) was applied onto the phosphor sheet cut into small pieces, and then the phosphor sheet was arranged and attached in such a way that the sheet surface having the die bonding paste applied thereon is brought into contact with a chip surface of a substrate having a face up type blue LED chip 1 mm square mounted thereon. The resulting sheet was heated at 100° C. for 1 minute on a hot plate to cure the die bonding paste. "OE-6630 A/B" (manufactured by Dow Corning Toray Co., Ltd.) was used as an encapsulation material for encapsulating the sheet to obtain a light emitting device (FIG. 3). The above-mentioned light resistance test and heat resistance test were performed on the obtained light emitting device, and the results of the tests are shown in Table 3. In all phosphor sheets, both of the light resistance test and the heat resistance test showed the results which had no problems in practical use or better results than this, and particularly in the heat resistance test, very good results were obtained. It was found from these Examples that when the content of a phosphor is 57 weight % or more of the entire sheet, the phosphor sheet is more excellent in light resistance, and when the content is 60 weight % or more of the entire sheet, the phosphor sheet is particularly excellent in light resistance.

Comparative Examples 5 to 7

Each phosphor sheet was prepared and evaluated by following the same operations as in Example 1 except for changing the inorganic phosphor, the phosphor content and the sheet thickness, respectively, to inorganic phosphors and values shown in Table 4. The results are shown in Table 4. Each light resistance test showed an inadequate result.

Comparative Example 8

A light emitting device was prepared and evaluated by following the same operations as in Example 16 except for changing the phosphor content and the sheet thickness, respectively, to values shown in Table 4. The results are shown in Table 4. Each light resistance test showed an inadequate result.

Comparative Example 9

A light emitting device was prepared and evaluated by following the same operations as in Example 20 except for changing the phosphor content and the sheet thickness, respectively, to values shown in Table 4. The results are shown in Table 4. The heat resistance test showed a good result, but the light resistance test showed an inadequate result.

Effect of Silicone Particle Content

Example 24

Using a 300 ml polyethylene container, 39.8% by weight of "OE-6630 A/B" (manufactured by Dow Corning Toray, Co., Ltd., refractive index 1.53) as a silicone resin, 60% by weight of "NYAG-02" (manufactured by Internatix Corporation: YAG-based phosphor doped with Ce, specific gravity: 4.8 g/cm$^3$) as a phosphor, and 0.2 parts by weight of Silicone Fine Particles 1 were mixed.

Thereafter, the resulting mixture was stirred and deaerated at 1000 rpm for 20 minutes by using a planetary mixer/deaerator "MAZERUSTAR KK-400" (manufactured by KURABO INDUSTRIES LTD.) to obtain a sheet solution. The sheet solution was applied onto "Cerapeel" BLK (manufactured by Toray Advanced Film Co., Ltd.) by use of a slit die coater, heated at 130° C. for 2 hours, and dried to obtain a phosphor sheet having an average thickness of about 100 μm. A cross-section of the obtained phosphor sheet was observed by SEM, average particle sizes (D50) of the phosphor and the silicone fine particles were determined from the resulting SEM images, consequently, the average particle size of the phosphor particles was 7 μm and the average particle size of the silicone fine particles was 0.5 μm.

The obtained phosphor sheet was cut into a sheet 110 mm square, and a thickness was measured at 100 points spaced every 10 mm starting from a point 5 mm distance from an end. The results are shown in Table 5.

Examples 25 to 29

Each phosphor sheet was prepared in the same manner as in Example 24 except for varying a blending ratio of the Silicone Fine Particles 1 as shown in Table 5, and measurement of a cross-section by SEM and thickness measurement were conducted. The results are shown in Table 5.

Example 30

A phosphor sheet was prepared in the same manner as in Example 24 except for not adding the silicone fine particles, and measurement of a cross-section by SEM and thickness measurement were conducted. The results are shown in Table 5.

Examples 24 to 29 are excellent in thickness uniformity. In Example 30 in which the silicone fine particles were not added, discharging from a slit of a slit die coater was unstable and thickness variation was rather large.

Effects of Particle Size and Composition of Silicone Fine Particles

Examples 31 to 37

Each phosphor sheet was prepared in the same manner as in Example 24 except for using the same blending ratio of the silicone resin, the phosphor and the silicone fine particles as in Example 27 and varying a type of the silicone fine particles as shown in Table 6. Measurement of a cross-section by SEM and measurement of thickness variation of the obtained phosphor sheet were conducted, and each phosphor sheet was mounted on a blue LED together with the phosphor sheet obtained in Example 27, and correlated color temperature variation and brightness variation at the time of lighting up the LED were measured and evaluated. The results are shown in Table 6.

Examples 30, 38

With respect to Example 30 in which the silicone fine particles were not added and Example 38 in which silica fine particles ("Admafine" SO-E2 manufactured by Admatechs Co., Ltd) were added in place of silicone fine particles, as with Examples 31 to 37, a phosphor sheet was prepared, and measurement of a cross-section by SEM and evaluations of thickness variation, correlated color temperature variation and brightness variation were conducted. In Example 30 in which the silicone fine particles were not added, not only the thickness variation but also the correlated color temperature variation and the brightness variation were larger than those of Examples 27 and 31 to 37. Further, in Example 38 in which silica fine particles were added, the thickness variation and the correlated color temperature variation favorably compared with those of Examples 27 and 31 to 37 in which the silicone fine particles were added, but brightness variation was larger than those of Examples 27 and 31 to 37. The reason for this is probably that light scattering by the silica fine particles in the silicone resin is larger than that by the silicone fine particles in the silicone resin.

Examples 39 to 42

Each phosphor sheet was prepared in the same manner as in Example 24 except for using the same material as in Example 27 and varying the content of the phosphor. The content of the Silicone Fine Particles 1 was adjusted so as to be 10 weight of the total weight of the silicone resin and the silicone fine particles. With respect to Examples 27 and 39 to 42, measurement of a cross-section by SEM and evaluations of thickness variation, correlated color temperature variation and brightness variation were conducted, and the light resistance and the heat resistance were evaluated with brightness retention. The results are shown in Table 7.

All samples exhibited small variations and excellent properties, and Examples 27, 39, 40 and 42 exhibited excellent light resistance and excellent heat resistance. Example 41 was also at a level of no problems in practical use with light resistance and heat resistance.

TABLE 1

|  |  | Example 1 | Example 2 | Example 3 | Example 4 | Example 5 | Example 6 |
|---|---|---|---|---|---|---|---|
| Silicon Resin | Type | OE-6630A/B | OE-6630A/B | OE-6630A/B | OE-6630A/B | OE-6630A/B | OE-6630A/B |
|  | Amount (weight %) | 47 | 47 | 47 | 35 | 47 | 43 |
| Phosphor | Type | NYAG-02 | NYAG-02 | NYAG-02 | NYAG-02 | NYAG-02 | NYAG-02 |
|  | Amount (weight %) | 53 | 53 | 53 | 65 | 53 | 57 |
| Sheet Thickness (μm) | | 200 | 100 | 300 | 40 | 50 | 50 |
| Type of Blue LED | | flip chip | flip chip | flip chip | flip chip | flip chip | flip chip |
| Brightness Retention-I | | 88 | 90 | 90 | 95 | 88 | 90 |
| Light Resistance | | B | A | A | S | B | A |
| Brightness Retention-II | | 83 | 87 | 80 | 95 | 90 | 90 |
| Heat Resistance | | A | A | B | S | S | S |

|  |  | Example 7 | Example 8 | Example 9 | Example 10 | Example 11 | Example 12 |
|---|---|---|---|---|---|---|---|
| Silicon Resin | Type | OE-6630A/B | OE-6630A/B | OE-6630A/B | OE-6630A/B | OE-6336A/B | OE-6336A/B |
|  | Amount (weight %) | 40 | 35 | 20 | 10 | 47 | 35 |
| Phosphor | Type | NYAG-02 | NYAG-02 | NYAG-02 | NYAG-02 | NYAG-02 | NYAG-02 |
|  | Amount (weight %) | 60 | 65 | 80 | 90 | 53 | 65 |
| Sheet Thickness (μm) | | 50 | 50 | 50 | 50 | 50 | 50 |
| Type of Blue LED | | flip chip | flip chip | flip chip | flip chip | flip chip | flip chip |
| Brightness Retention-I | | 95 | 95 | 95 | 95 | 87 | 95 |
| Light Resistance | | S | S | S | S | B | S |
| Brightness Retention-II | | 90 | 90 | 90 | 90 | 90 | 90 |
| Heat Resistance | | S | S | S | S | S | S |

TABLE 2

|  |  | Comparative Example 1 | Comparative Example 2 | Comparative Example 3 | Comparative Example 4 |
|---|---|---|---|---|---|
| Silicone Resin | Type | OE-6630A/B | OE-6630A/B | OE-6630A/B | OE-6630A/B |
|  | Amount (weight %) | 50 | 70 | 50 | 70 |
| Phosphor | Type | NYAG-02 | NYAG-02 | NYAG-02 | NYAG-02 |
|  | Amount (weight %) | 50 | 30 | 50 | 30 |
| Sheet Thickness (μm) | | 200 | 200 | 50 | 50 |
| Type of Blue LED | | flip chip | flip chip | flip chip | flip chip |
| Brightness Retention-I | | 75 | 45 | 77 | 45 |
| Light Resistance | | C | D | C | D |
| Brightness Retention-II | | 83 | 83 | 90 | 90 |
| Heat Resistance | | A | A | S | S |

TABLE 3

|  |  | Example 13 | Example 14 | Example 15 | Example 16 | Example 17 | Example 18 |
|---|---|---|---|---|---|---|---|
| Silicone Resin | Type | OE-6630A/B | OE-6630A/B | OE-6630A/B | OE-6630A/B | OE-6630A/B | OE-6630A/B |
|  | Amount (weight %) | 35 | 35 | 35 | 47 | 43 | 40 |
| Phosphor | Type | R6634 | G2060 | EY-4254 | NYAG-02 | NYAG-02 | NYAG-02 |
|  | Amount (weight %) | 65 | 65 | 65 | 53 | 57 | 60 |
| Sheet Thickness (μm) | | 50 | 50 | 50 | 50 | 50 | 50 |
| Type of Blue LED | | flip chip | flip chip | flip chip | face up-I | face up-I | face up-I |
| Brightness Retention-I | | 95 | 95 | 95 | 85 | 90 | 95 |
| Light Resistance | | S | S | S | B | A | S |
| Brightness Retention-II | | 90 | 90 | 90 | 90 | 90 | 90 |
| Heat Resistance | | S | S | S | S | S | S |

|  |  | Example 19 | Example 20 | Example 21 | Example 22 | Example 23 |
|---|---|---|---|---|---|---|
| Silicone Resin | Type | OE-6630A/B | OE-6630A/B | OE-6630A/B | OE-6630A/B | OE-6630A/B |
|  | Amount (weight %) | 35 | 47 | 43 | 40 | 35 |
| Phosphor | Type | NYAG-02 | NYAG-02 | NYAG-02 | NYAG-02 | NYAG-02 |
|  | Amount (weight %) | 65 | 53 | 57 | 60 | 65 |

TABLE 3-continued

|  | | | | | |
|---|---|---|---|---|---|
| Sheet Thickness (μm) | 50 | 50 | 50 | 50 | 50 |
| Type of Blue LED | face up-I | face up-II | face up-II | face up-II | face up-II |
| Brightness Retention-I | 97 | 86 | 91 | 96 | 97 |
| Light Resistance | S | B | A | S | S |
| Brightness Retention-II | 90 | 90 | 90 | 90 | 90 |
| Heat Resistance | S | S | S | S | S |

TABLE 4

|  |  | Comparative Example 5 | Comparative Example 6 | Comparative Example 7 | Comparative Example 8 | Comparative Example 9 |
|---|---|---|---|---|---|---|
| Silicone Resin | Type | OE-6630A/B | OE-6630A/B | OE-6630A/B | OE-6630A/B | OE-6630A/B |
|  | Amount (weight %) | 50 | 70 | 50 | 50 | 50 |
| Phosphor | Type | EY-4254 | EY-4254 | EY-4254 | NYAG-02 | NYAG-02 |
|  | Amount (weight %) | 50 | 30 | 50 | 50 | 50 |
| Sheet Thickness (μm) | | 200 | 200 | 50 | 50 | 50 |
| Type of Blue LED | | flip chip | flip chip | flip chip | face up-I | face up-II |
| Brightness Retention-I | | 70 | 45 | 70 | 71 | 72 |
| Light Resistance | | C | D | C | C | C |
| Brightness Retention-II | | 81 | 81 | 90 | 90 | 90 |
| Heat Resistance | | A | A | S | S | S |

TABLE 5

|  |  | Example 24 | Example 25 | Example 26 | Example 27 | Example 28 | Example 29 | Example 30 |
|---|---|---|---|---|---|---|---|---|
| Silicone Resin (refractive index 1.53) (weight %) | | 39.8 | 38.0 | 38.0 | 36.0 | 34.0 | 32.0 | 40.0 |
| Phosphor (YAG) (weight %) | | 60.0 | 60.0 | 60.0 | 60.0 | 60.0 | 60.0 | 60.0 |
| Silicone Fine Particles 1 (weight %) (refractive index 1.54) | | 0.2 | 0.4 | 2.0 | 4.0 | 6.0 | 8.0 | 0.0 |
| Particle Size of Silicone Fine Particle (μm) | | 0.5 | 0.5 | 0.5 | 0.5 | 0.5 | 0.5 | — |
| Phosphor Sheet Thickness | Maximum (μm) | 107.1 | 105.5 | 101.5 | 103.6 | 105.1 | 108.4 | 118.9 |
|  | Minimum (μm) | 96.5 | 98.0 | 96.3 | 97.8 | 96.8 | 94.6 | 89.6 |
|  | Average (μm) | 101.6 | 102.2 | 99.1 | 100.6 | 101.0 | 101.3 | 103.9 |
|  | Variation B (%) | 5.5 | −4.2 | −2.8 | 3.0 | −4.2 | 7.1 | 15.0 |

TABLE 6

|  |  | Example 27 | Example 31 | Example 32 | Example 33 | Example 34 | Example 35 | Example 36 | Example 37 |
|---|---|---|---|---|---|---|---|---|---|
| Silicone Resin (refractive index 1.53) (weight %) | | 36.0 | 36.0 | 36.0 | 36.0 | 36.0 | 36.0 | 36.0 | 36.0 |
| Phosphor (YAG) (weight %) | | 60.0 | 60.0 | 60.0 | 60.0 | 60.0 | 60.0 | 60.0 | 60.0 |
| Silicone Fine Particles 2 (weight %) | refractive index 1.54 | — | 4.0 | — | — | — | — | — | — |
| Silicone Fine Particles 1 (weight %) | | 4.0 | — | — | — | — | — | — | — |
| Silicon Fine Particles 3 (weight %) | | — | — | 4.0 | — | — | — | — | — |
| Silicone Fine Particles 4 (weight %) | | — | — | — | 4.0 | — | — | — | — |

TABLE 6-continued

|  |  | Example 27 | Example 31 | Example 32 | Example 33 | Example 34 | Example 35 | Example 36 | Example 37 |
|---|---|---|---|---|---|---|---|---|---|
| Silicone Fine Particles 5 (weight %) |  | — | — | — | — | 4.0 | — | — | — |
| Silicone Fine Particles 6 (weight %) | refractive index 1.46 | — | — | — | — | — | 4.0 | — | — |
| Silicon Fine Particles 7 (weight %) | refractive index 1.52 | — | — | — | — | — | — | 4.0 | — |
| Silicone Fine Particles 8 (weight %) | refractive index 1.57 | — | — | — | — | — | — | — | 4.0 |
| Silica Fine Particles (weight %) | refractive index 1.46 | — | — | — | — | — | — | — | — |
| Average Particle Size of Silicone Fine Particles or Silica Fine Particles (μm) |  | 0.5 | 0.1 | 1.0 | 1.5 | 5.0 | 0.5 | 0.5 | 0.5 |
| Thickness Variation of Phosphor Sheet (%) |  | −2.9 | −2.0 | −3.0 | 4.0 | −5.5 | 2.7 | 2.2 | −2.9 |
| Correlated Color Temperature Variation (K) around 4500 K |  | 87 | 82 | 92 | 98 | 117 | 89 | 83 | 94 |
| Brightness (cd/m²) | Maximum | 1.56 | 1.57 | 1.53 | 1.54 | 1.55 | 1.42 | 1.51 | 1.46 |
|  | Minimum | 1.47 | 1.49 | 1.45 | 1.46 | 1.36 | 1.34 | 1.42 | 1.38 |
|  | Average | 1.51 | 1.52 | 1.50 | 1.49 | 1.46 | 1.39 | 1.46 | 1.41 |
|  | Brightness Variation | 0.05 | 0.05 | −0.05 | 0.05 | −0.10 | −0.05 | 0.05 | 0.05 |

TABLE 7

|  |  | Example 27 | Example 39 | Example 40 | Example 41 | Example 42 |
|---|---|---|---|---|---|---|
| Silicone Resin 1 (weight %) |  | 36.0 | 22.5 | 40.5 | 45.0 | 13.5 |
| Phosphor (YAG) (weight %) |  | 60.0 | 75.0 | 55.0 | 50.0 | 85.0 |
| Silicone Fine Particles 1 (weight %) (refractive index 1.54) |  | 4.0 | 2.5 | 4.5 | 5.0 | 1.5 |
| Average Particle Size of Silicone Fine Particles (μm) |  | 0.5 | 0.5 | 0.5 | 0.5 | 0.5 |
| Phosphor Sheet Thickness | Maximum (μm) | 101.5 | 83.6 | 113.3 | 124.6 | 75.0 |
|  | Minimum (μm) | 96.3 | 78.5 | 108.6 | 117.7 | 67.1 |
|  | Average (μm) | 99.1 | 81.0 | 110.9 | 121.1 | 71.1 |
|  | Variation B (%) | −2.8 | 2.6 | 2.4 | 3.5 | −4.0 |
| Correlated Color Temperature Variation (K) around 4500 K |  | 87 | 91 | 81 | 95 | 100 |
| Brightness (cd/m²) | Maximum | 1.56 | 1.56 | 1.57 | 1.58 | 1.53 |
|  | Minimum | 1.47 | 1.47 | 1.51 | 1.50 | 1.38 |
|  | Average | 1.51 | 1.51 | 1.55 | 1.53 | 1.46 |
|  | Brightness Variation | 0.05 | 0.05 | −0.04 | 0.05 | −0.08 |
| Brightness Retention (%) | I (light resistance) | 95 | 99 | 91 | 80 | 98 |
|  | II (heat resistance) | 90 | 96 | 85 | 72 | 95 |

REFERENCE SIGNS LIST

1 phosphor sheet
2 LED chip
3 electrode
4 circuit board
5 metal fine wire

The invention claimed is:

1. A phosphor sheet containing a phosphor, a silicone resin, and silicone fine particles having an average particle size from 0.1 μm to 2 μm, wherein a content of the phosphor is from 53 weight % to 90 weight % of the sheet, and wherein the sheet has a thickness of 200 μm or less.

2. The phosphor sheet according to claim 1, wherein the content of the phosphor is from 57 weight % to 90% weight of the sheet.

3. The phosphor sheet according to claim 1, wherein the content of the phosphor is 60 weight % to 90% weight of the sheet.

4. The phosphor sheet according to claim 1, wherein a thickness of the sheet is 100 μm or less.

5. The phosphor sheet according to claim 1, wherein the phosphor is an inorganic phosphor.

6. The phosphor sheet according to claim 1, wherein a content of the silicone fine particles is 1 part by weight or more and 20 parts by weight or less with respect to 100 parts by weight of the silicone resin.

7. The phosphor sheet according to claim 1, wherein the silicone fine particles are made of a silicone resin obtained by condensing organosilane.

8. The phosphor sheet according to claim 1, wherein a difference between a refractive index d1 of the silicone fine particles and a refractive index d2 of the silicone resin is smaller than plus or minus 0.10.

9. The phosphor sheet according to claim 1, wherein the phosphor is particulate and an average particle size of the phosphor particles is 1 μm or more and 20 μm or less.

10. The phosphor sheet according to claim 1, wherein the silicone resin is an addition cure silicone resin formed by hydrosilylation of a compound containing at least an alkenyl group bound to a silicon atom with a compound containing a hydrogen atom bound to a silicon atom.

11. The phosphor sheet according to claim 1, which is used for covering a surface of an LED.

12. A cured product obtained by curing the phosphor sheet according to claim 1.

13. An LED having the phosphor sheet according to claim 1 or a cured product thereof.

14. A method for manufacturing an LED comprising a step of bonding the phosphor sheet according to claim 1 to an LED chip.

15. A method for manufacturing an LED comprising a step of bonding the phosphor sheet according to claim 1 to an LED chip; and a step of curing the phosphor sheet.

16. A light emitting device comprising the LED according to claim 13.

\* \* \* \* \*